United States Patent
Huebner et al.

(10) Patent No.: US 6,268,659 B1
(45) Date of Patent: *Jul. 31, 2001

(54) SEMICONDUCTOR BODY WITH LAYER OF SOLDER MATERIAL COMPRISING CHROMIUM

(75) Inventors: Holger Huebner, Baldham; Manfred Schneegans, Vaterstetten, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 08/937,908

(22) Filed: Sep. 25, 1997

(30) Foreign Application Priority Data

Sep. 25, 1996 (DE) .............................................. 196 39 438

(51) Int. Cl.⁷ .................................................... H01L 23/48
(52) U.S. Cl. .......................... 257/766; 257/751; 257/772
(58) Field of Search .................................... 257/751, 766, 257/772, 784, 777; 438/617; 228/254

(56) References Cited

U.S. PATENT DOCUMENTS

| | | | |
|---|---|---|---|
| 3,607,379 | * 9/1971 | Leinkram et al. | 117/212 |
| 3,729,807 | * 5/1973 | Fujiwara | 29/473.1 |
| 4,463,059 | * 7/1984 | Bhattacharya et al. | 428/620 |
| 4,620,215 | * 10/1986 | Lee | 257/713 |
| 4,772,935 | * 9/1988 | Lawier et al. | 257/751 |
| 4,954,870 | * 9/1990 | Takemura et al. | 257/673 |
| 5,289,016 | 2/1994 | Noguchi | 257/57 |
| 5,514,912 | * 5/1996 | Ogashiwa | 257/784 |
| 5,532,183 | 7/1996 | Sugawara | 438/253 |
| 5,855,993 | * 1/1999 | Brady et al. | 428/209 |
| 5,901,901 | * 5/1999 | Schneegans et al. | 228/254 |

FOREIGN PATENT DOCUMENTS

| | | |
|---|---|---|
| 0 186 411 A2 | 7/1986 | (EP) . |
| 0 790 647 A2 | 8/1997 | (EP) . |
| 1-198031 | 8/1989 | (JP) . |

OTHER PUBLICATIONS

International Patent Application WO 82/02457 (Finn et al.), dated Jul. 22, 1982.

"Fabrication of Thin Film Transistors by Chemical Mechanical Polished Polycrystalline Silicon Films" (Chun–Yen Chang et al.), IEEE Electron Device Letters, vol. 17, No. 3, Mar. 1996, pp. 100–102.

"Polycrystalline silicon oxidation method improving surface roughness at the oxide/polycrystalline silicon interface" (Muyng–Chul Jun et al.), Appl. Phys. Lett. 66 (17), Apr. 1995, pp. 2206–2208.

* cited by examiner

Primary Examiner—Olik Chaudhuri
Assistant Examiner—(Vikki) Hoa B. Trinh
(74) Attorney, Agent, or Firm—Herbert L. Lerner; Laurence A. Greenberg; Werner H. Stemer

(57) ABSTRACT

A semiconductor body with a layer of solder material and a method for soldering the semiconductor body include a chromium layer applied to a rear side of the semiconductor body, and a tin layer applied to the chromium layer. The semiconductor is subsequently soldered directly to the metal substrate, that is without further additives, by being heated to temperatures above 250° C. This metal layer system for soldering power semiconductors to cooling bodies enables two metal layers to be dispensed with as compared with known four metal layer systems.

8 Claims, 1 Drawing Sheet

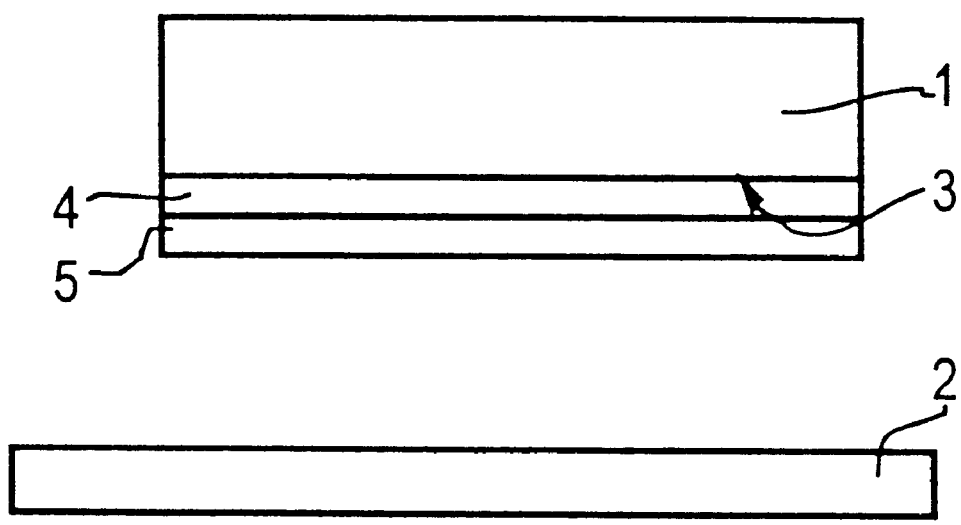

SEMICONDUCTOR BODY WITH LAYER OF SOLDER MATERIAL COMPRISING CHROMIUM

BACKGROUND OF THE INVENTION

Field of the Invention

The invention relates to a semiconductor body formed of silicon, which can be soldered to a metal substrate through a sequence of metal layers. The invention also relates to a method for soldering the semiconductor body.

Such semiconductor bodies are built into semiconductor components, especially power semiconductor components, great numbers of which are on the market. The sequence of metal layers as a rule includes an aluminum layer, which is seated on a silicon semiconductor body. The aluminum layer adheres well to silicon and forms a satisfactory ohmic contact, especially with p-doped silicon. A diffusion barrier layer which is seated on the aluminum layer in the prior art is usually formed of titanium or chromium and acts as an adhesion promoter and a rear-side barrier between a nickel layer that is seated on the diffusion barrier layer and the aluminum layer. A noble metal layer is applied either directly over the nickel layer in the prior art or over a succeeding thin titanium layer that serves to improve adhesion. The noble metal layer usually is silver, gold or palladium and acts as an oxidation guard for the nickel layer.

It is known from German Published, Non-Prosecuted Patent Application DE-OS 19 606 101, corresponding to U.S. Pat. No. 5,901,901, to apply a solder material layer onto the diffusion barrier layer. In that reference, the semiconductor body is then typically soldered onto the metal substrate by being applied to the substrate and soldered directly to the substrate, that is without the addition of further soldering agents and fluxing agents, by being heated to temperatures of above approximately 250° C.

A disadvantage of that method and that metal system is that at least one diffusion barrier layer, one adhesion layer, and one solder layer must be used in order to make a usable, solid soldered connection between the metal substrate and the semiconductor body.

German Published, Non-Prosecuted Patent Application DE-OS 19 606 101, in particular, discloses a metal system simplified by two layers, in which in particular one nickel layer that is approximately 1 pm thick is dispensed with, thus considerably reducing the tension in the metal system and therefore causing less wafer warping. In that reference the nickel layer can be dispensed with because the method of "isothermal solidification" is employed as the soldering method, in which the solder layer is so thin, that is approximately 3 $\mu$m, that it is entirely converted into intermetallic phases. That limits the incorporation of solder, particularly tin, into the neighboring layer by alloying. The electrical connection with the silicon semiconductor body is achieved with an aluminum layer, as before, and aluminum silicide forms at the interface.

SUMMARY OF THE INVENTION

It is accordingly an object of the invention to provide a semiconductor body with a layer of solder material and a method for soldering the semiconductor body, which overcome the hereinafore-mentioned disadvantages of the heretofore-known devices and methods of this general type and which provide a silicon semiconductor body which is metallized in such a way that the number of metal layers which is required is reduced even further, while preserving the characteristic of only slight wafer warping and without having to make sacrifices in the strength of adhesion to substrate materials.

With the foregoing and other objects in view there is provided, in accordance with the invention, a silicon semiconductor body to be soldered to a metal substrate through a sequence of metal layers, comprising a chromium layer applied to the rear side of the semiconductor body and a tin layer applied to the chromium layer.

With the objects of the invention in view, there is also provided a method for soldering a semiconductor body onto a metal substrate, which comprises applying a chromium layer to a rear side of a silicon semiconductor body; applying a tin layer to the chromium layer; applying the semiconductor body to a substrate; and soldering the semiconductor body directly to the substrate, that is without the addition of further soldering agents and fluxing agents, by heating to temperatures above approximately 250° C.

In accordance with another feature of the invention, the chromium layer is applied by sputtering, and the tin layer is vapor-deposited onto the sputtered-on chromium layer. The metal system is thus reduced to two layers, chromium and tin.

In accordance with a further feature of the invention, the chromium layer is approximately 50 nm thick.

In accordance with a concomitant feature of the invention, the tin layer is less than 3000 nm thick.

Chromium and tin, upon being heated to above the melting point of the tin, form the metastable intermetallic phase $Cr_2Sn_3$. That phase was first discovered in 1964 and is known and described by L. Hollan, P. Lecoq and A. Michel, in a paper entitled: Preparation d'un composé défini $Cr_2Sn_3$ á partir d'un amalgame de chrome et d'étain [Preparation of a Defined $Cr_2Sn_3$ Compound From an Amalgam of Chromium and Tin], in C. R. Acad. Sc. Paris, 258 (1964) 3309. It is stable up to 438° C. However, it forms only when chromium and tin are made to react with one another below that critical temperature. The phase cannot be obtained by cooling from a melt that has a temperature of over 438° C.

Through the use of the novel process, virtually tension-free solder layers are created, which lead to substrate warping of less than 300 $\mu$m. Moreover, the adhesion strength of the soldered semiconductor body on the substrates is very high, that is in ranges of >30 MPa. Samples can withstand 500 temperature shock cycles from −45° C. to 120° C. Moreover, the chromium silicide layer, which acts as a diffusion barrier and exists at the interface between the silicon semiconductor body and the chromium layer, is demonstrated through the use of auger depth profile analyses. Even after tempering up to 400° C., no tin was found in the silicon.

A pronounced cost reduction can moreover be attained with the semiconductor bodies metallized according to the invention and the method of the invention, since the material costs can be lowered, especially because an oxide guard layer is omitted, and the throughput can be increased. Moreover, the method of the invention is especially environmentally friendly, because the freedom from fluxing agents makes it unnecessary to perform cleaning using HCFCs.

Other features which are considered as characteristic for the invention are set forth in the appended claims.

Although the invention is illustrated and described herein as embodied in a semiconductor body with a layer of solder material and a method for soldering the semiconductor body, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a sectional view of an embodiment of a semiconductor body according to the invention.

DESCRIPTION OF THE PREFERRED EMBODIMENTS

Referring now in detail to the single FIGURE of the drawing, there is seen a layer sequence of metals before soldering. According to the invention, a chromium layer 4 is applied by sputtering to a rear side 3 of a semiconductor body 1. This layer 4 adheres well to silicon and forms a satisfactory ohmic contact particularly with p-doped silicon. A tin layer 5 which is seated on the chromium layer 4 acts as a solder layer. The chromium layer 4 substantially has a thickness of approximately 50 nm. This tin layer 5 is sputtered onto the chromium layer 4. The tin layer 5 typically has a thickness of approximately 2700 nm. The thus-metallized silicon semiconductor body 1 is then pressed onto a metal substrate 2, which as a rule is formed of copper, and is bonded to it at approximately 300° C. in a protected gas atmosphere or under vacuum conditions. The result is a metallurgical bond, with a $Cr_2Sn_3$ phase between the chromium layer 4 and tin layer 5 that is stable up to a temperature of 438° C.

Employing the method of the invention creates a high-quality product, because the layer sequence described herein produces an especially good mechanically and electrically stable contact. In particular, the method can be considered highly advantageous from not only technological but also economical and ecological standpoints.

Technologically, the method and the metallizing according to the invention open up the possibility of further reducing the thicknesses of silicon semiconductor substrates, which leads to an improvement in the conducting-state property in power semiconductor components. Economically, the advantages reside in the fact that the material costs can be reduced and the production capacity can be increased.

We claim:

1. A semiconductor body and substrate assembly, comprising:
   a silicon semiconductor body having a rear side;
   a metal substrate; and
   a sequence of metal layers for soldering said semiconductor body to said metal substrate, said metal layers including a chromium layer disposed on said rear side of said semiconductor body, a tin layer disposed on said chromium layer, and a $Cr_2Sn_3$ layer disposed between said chromium layer and said tin layer, said tin layer having a thickness less than 3000 nm.

2. The assembly according to claim 1, wherein said chromium layer is sputtered on said rear side of said semiconductor body, and said tin layer is vapor-deposited on said chromium layer.

3. The assembly according to claim 1, wherein said chromium layer is approximately 50 nm thick.

4. A semiconductor assembly, comprising:
   a silicon semiconductor body having a rear side; and
   a sequence of metal layers for soldering said semiconductor body to a metal substrate, said metal layers including a chromium layer applied to said rear side of said semiconductor body and a tin layer applied to said chromium layer, said tin layer having a thickness less than 3000 nm.

5. The assembly according to claim 4, wherein said chromium layer is sputtered on said rear side of said semiconductor body, and said tin layer is vapor-deposited on said chromium layer.

6. The assembly according to claim 4, wherein said chromium layer is approximately 50 nm thick.

7. A semiconductor arrangement, comprising:
   a silicon semiconductor body;
   a metal substrate; and
   at least one metal layer disposed between said silicon semiconductor body and said metal substrate, formed of chromium and tin and producing a $Cr_2Sn_3$ phase layer, said at least one metal layer including a tin layer having a thickness less than 3000 nm.

8. The arrangement according to claim 7, further comprising a chromium layer disposed between said silicon semiconductor body and said $Cr_2Sn_3$ phase layer.

* * * * *